(12) United States Patent
Chang et al.

(10) Patent No.: US 10,199,554 B2
(45) Date of Patent: *Feb. 5, 2019

(54) TRILAYER JOSEPHSON JUNCTION STRUCTURE WITH SMALL AIR BRIDGE AND NO INTERLEVEL DIELECTRIC FOR SUPERCONDUCTING QUBITS

(71) Applicant: International Business Machines Corporation, Armonk, NY (US)

(72) Inventors: Josephine B. Chang, Bedford Hills, NY (US); Gerald W. Gibson, Danbury, CT (US); Mark B. Ketchen, Hadley, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/363,656

(22) Filed: Nov. 29, 2016

(65) Prior Publication Data

US 2017/0077383 A1    Mar. 16, 2017

Related U.S. Application Data

(63) Continuation of application No. 14/749,115, filed on Jun. 24, 2015, now Pat. No. 9,564,573, which is a
(Continued)

(51) Int. Cl.
*H01L 21/00* (2006.01)
*H01L 39/22* (2006.01)
(Continued)

(52) U.S. Cl.
CPC .......... *H01L 39/223* (2013.01); *H01L 27/18* (2013.01); *H01L 39/025* (2013.01); *H01L 39/2493* (2013.01); *H01L 28/40* (2013.01)

(58) Field of Classification Search
None
See application file for complete search history.

(56) References Cited

U.S. PATENT DOCUMENTS

| 9,564,573 B1* | 2/2017 | Chang .................. H01L 39/025 |
| 2016/0148112 A1 | 5/2016 | Kwon |
| 2017/0098682 A1 | 4/2017 | Ladizinsky et al. |

FOREIGN PATENT DOCUMENTS

WO    2017217961 A1    12/2017

OTHER PUBLICATIONS

Josephine B. Chang, et al.; "Trilayer Josephson Junction Structure With Small Air Bridge and No Interlevel Dielectric for Superconducting Qubits"; U.S. Appl. No. 14/749,115, filed Jun. 24, 2015.
(Continued)

*Primary Examiner* — Jack Chen
(74) *Attorney, Agent, or Firm* — Cantor Colburn LLP; Vazken Alexanian

(57) ABSTRACT

A technique relates to a trilayer Josephson junction structure. A dielectric layer is on a base electrode layer that is on a substrate. A counter electrode layer is on the dielectric layer. First and second counter electrodes are formed from the counter electrode layer. First and second dielectric layers are formed from the dielectric layer. First and second base electrodes are formed from base electrode layer. The first counter electrode, first dielectric layer, and first base electrode form a first stack. The second counter electrode, second dielectric layer, and second base electrode form a second stack. A shunting capacitor is between first and second base electrodes. An ILD layer is deposited on the substrate, the first and second counter electrodes, and the first and second base electrodes. A contact bridge connects the first and second counter electrodes. An air gap is formed underneath the contact bridge by removing ILD.

20 Claims, 12 Drawing Sheets

Related U.S. Application Data continuation of application No. 14/700,741, filed on Apr. 30, 2015.

(51) Int. Cl.
    *H01L 39/24*     (2006.01)
    *H01L 39/02*     (2006.01)
    *H01L 27/18*     (2006.01)
    *H01L 49/02*     (2006.01)

(56) References Cited

OTHER PUBLICATIONS

Josephine B. Chang, et al.; "Trilayer Josephson Junction Structure With Small Air Bridge and No Interlevel Dielectric for Superconducting Qubits"; U.S. Appl. No. 14/700,741, filed Apr. 30, 2015.

\* cited by examiner

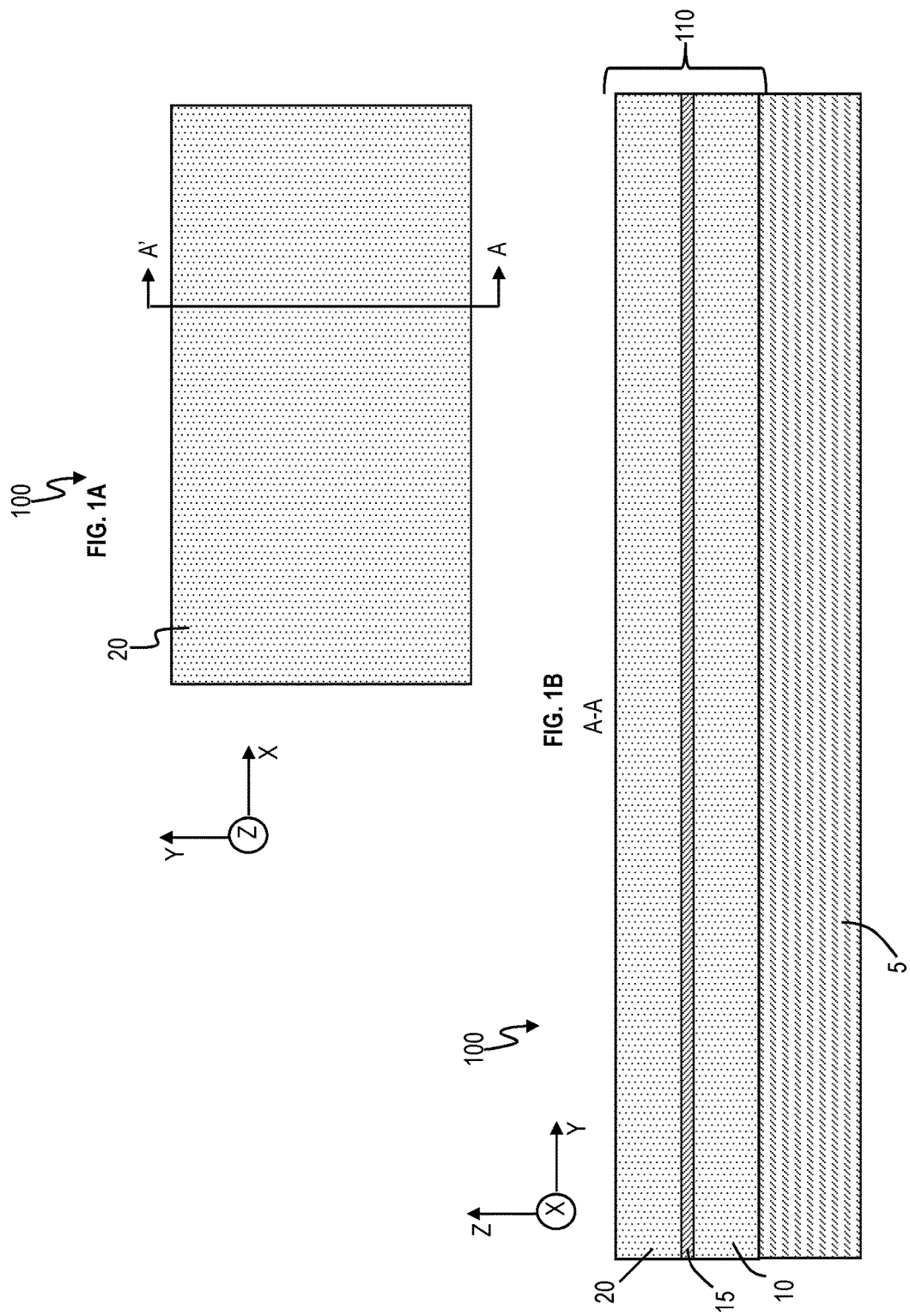

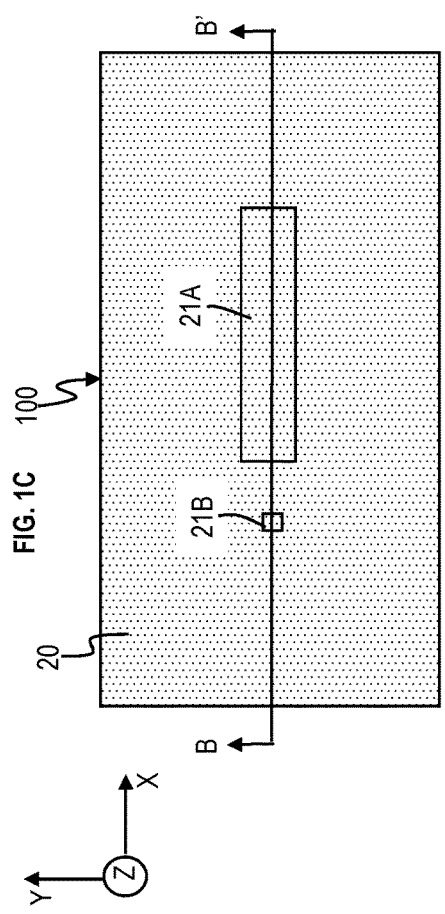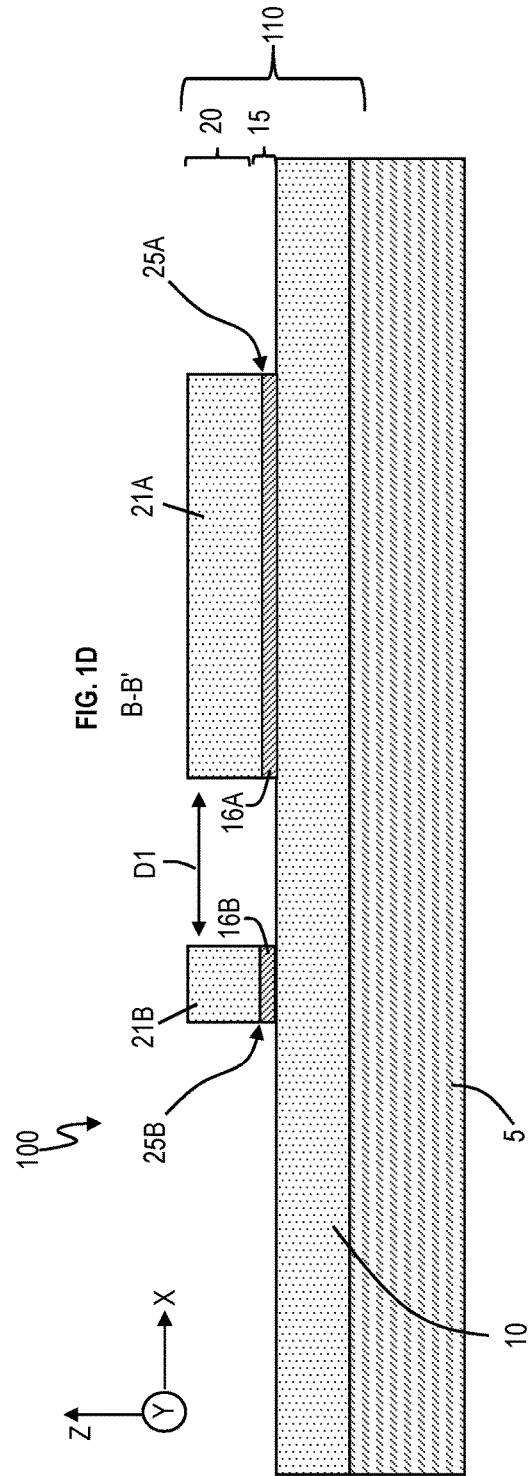

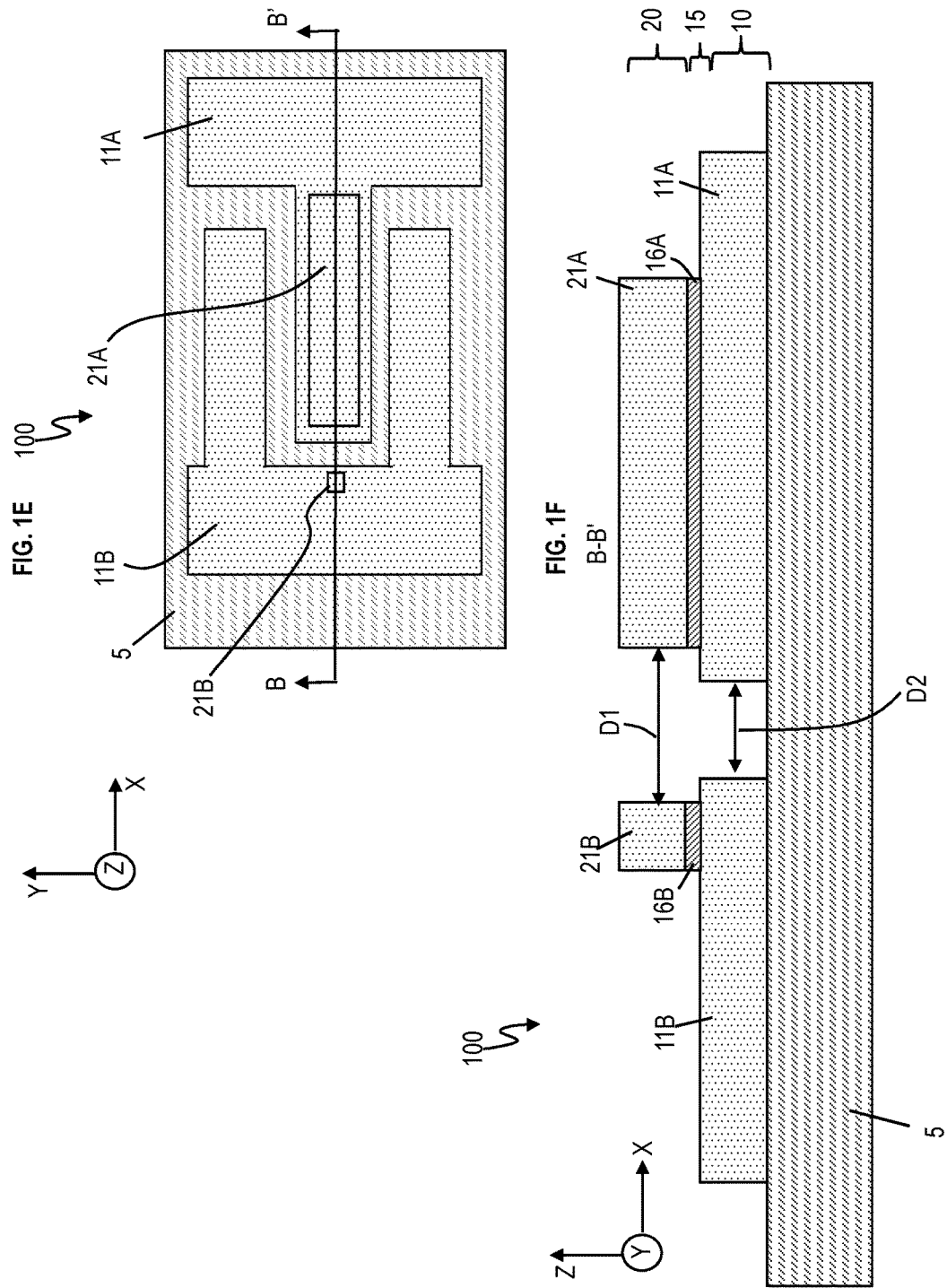

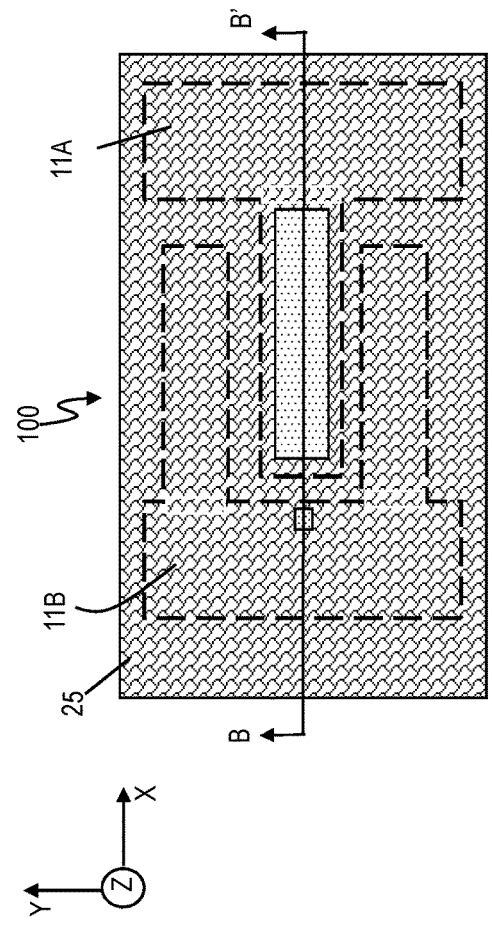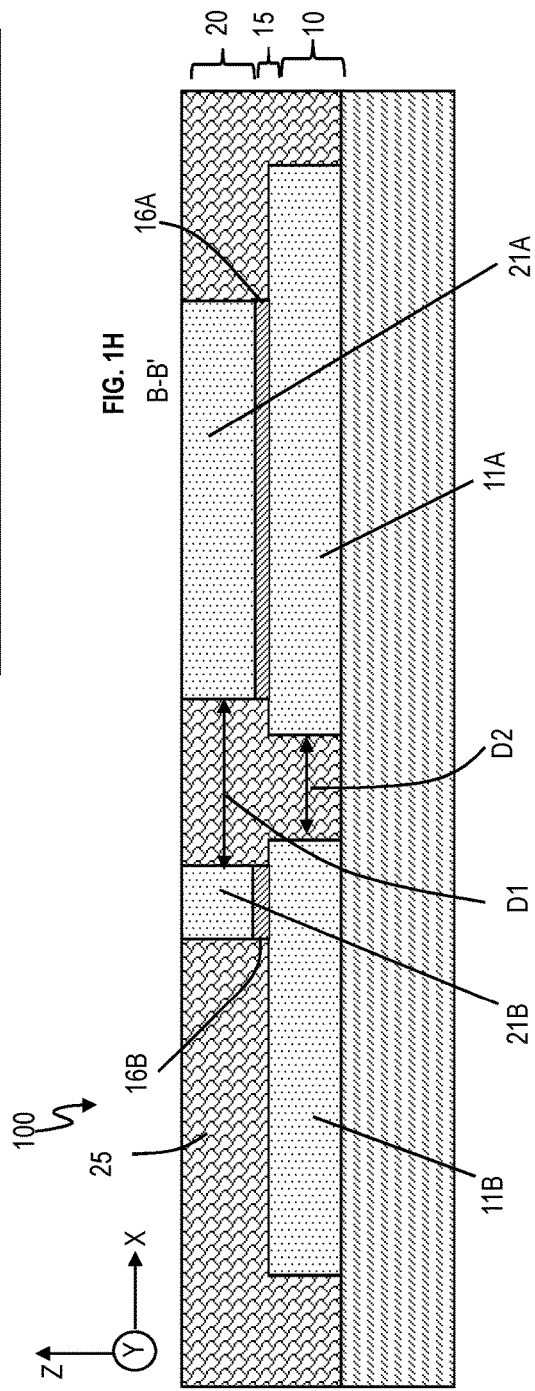

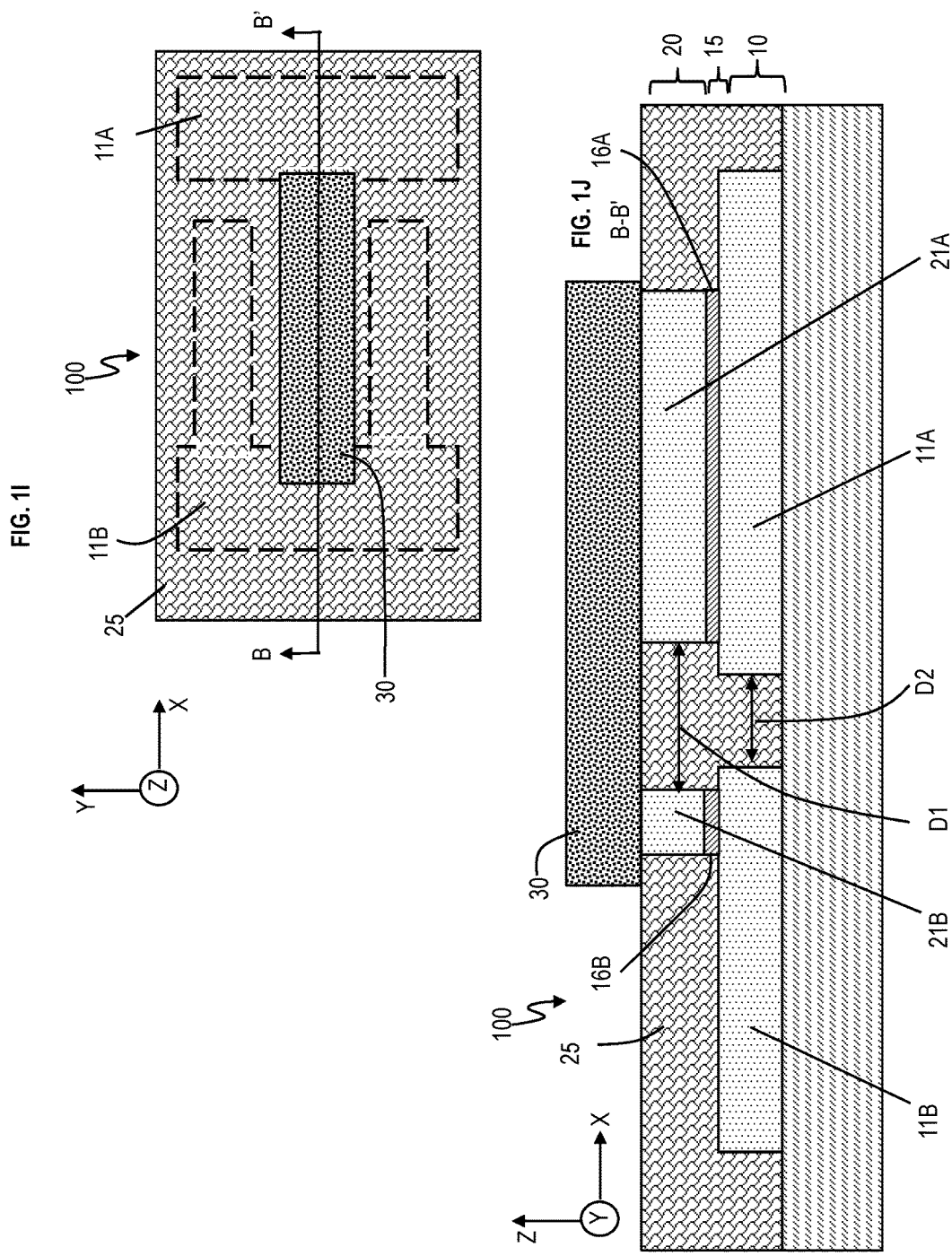

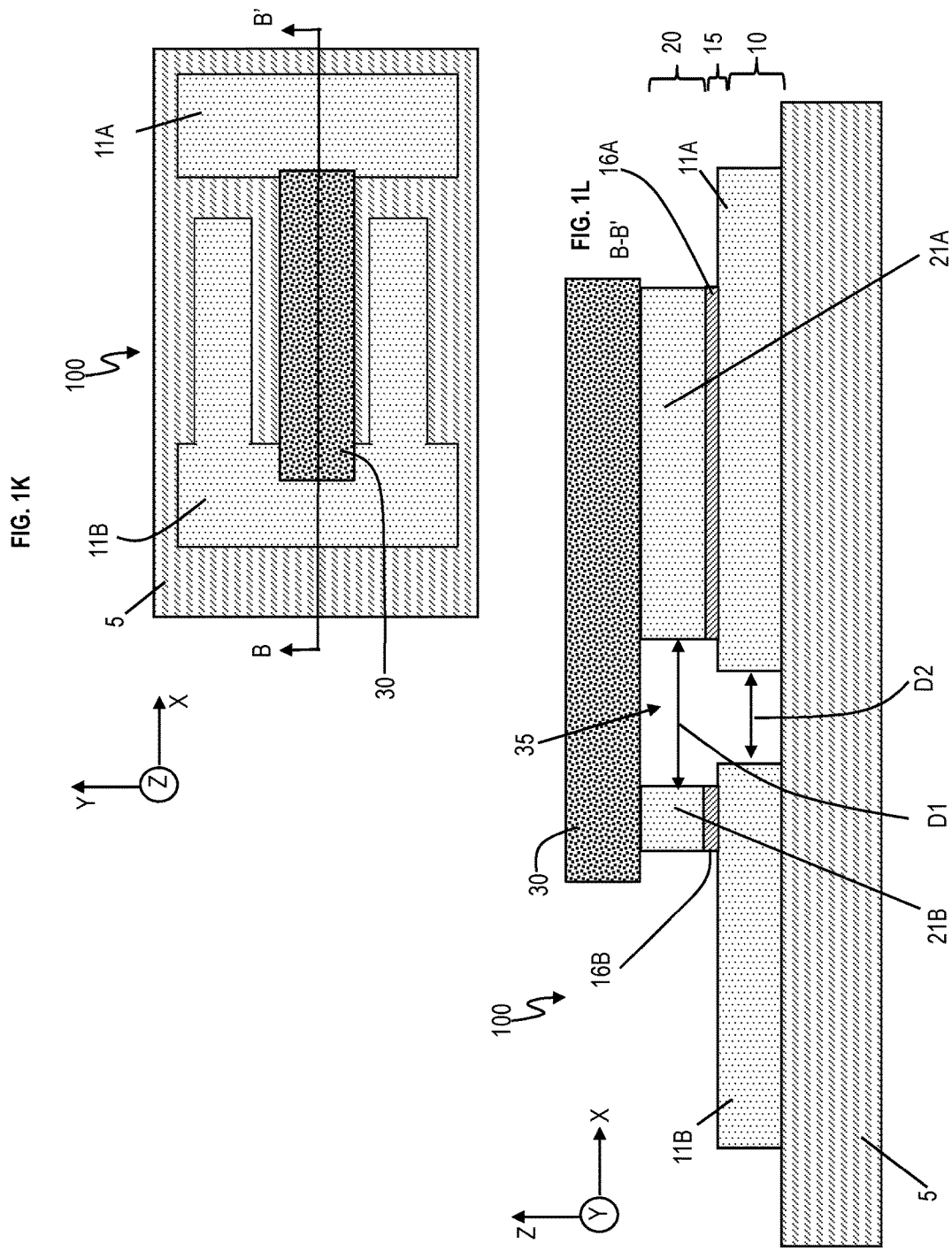

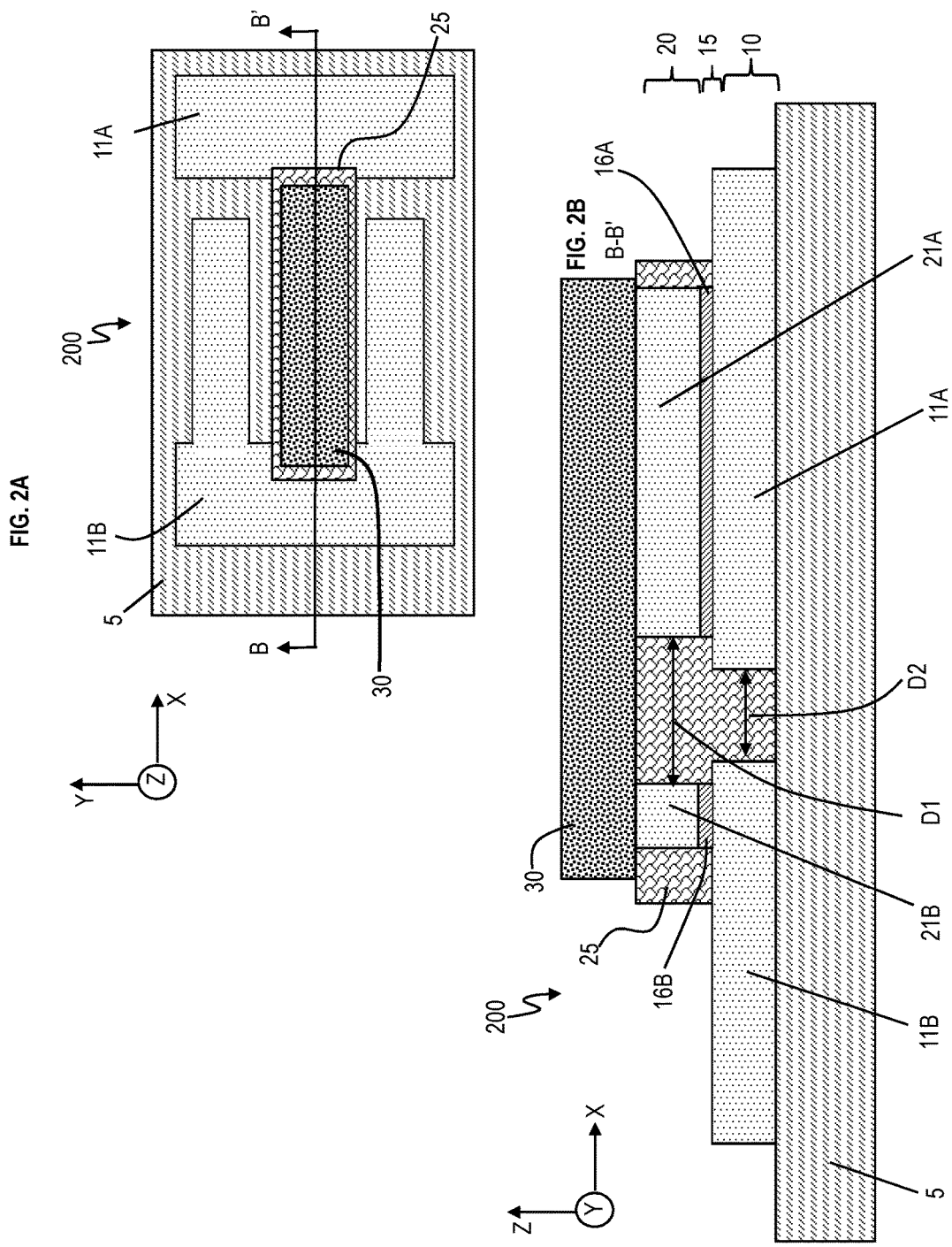

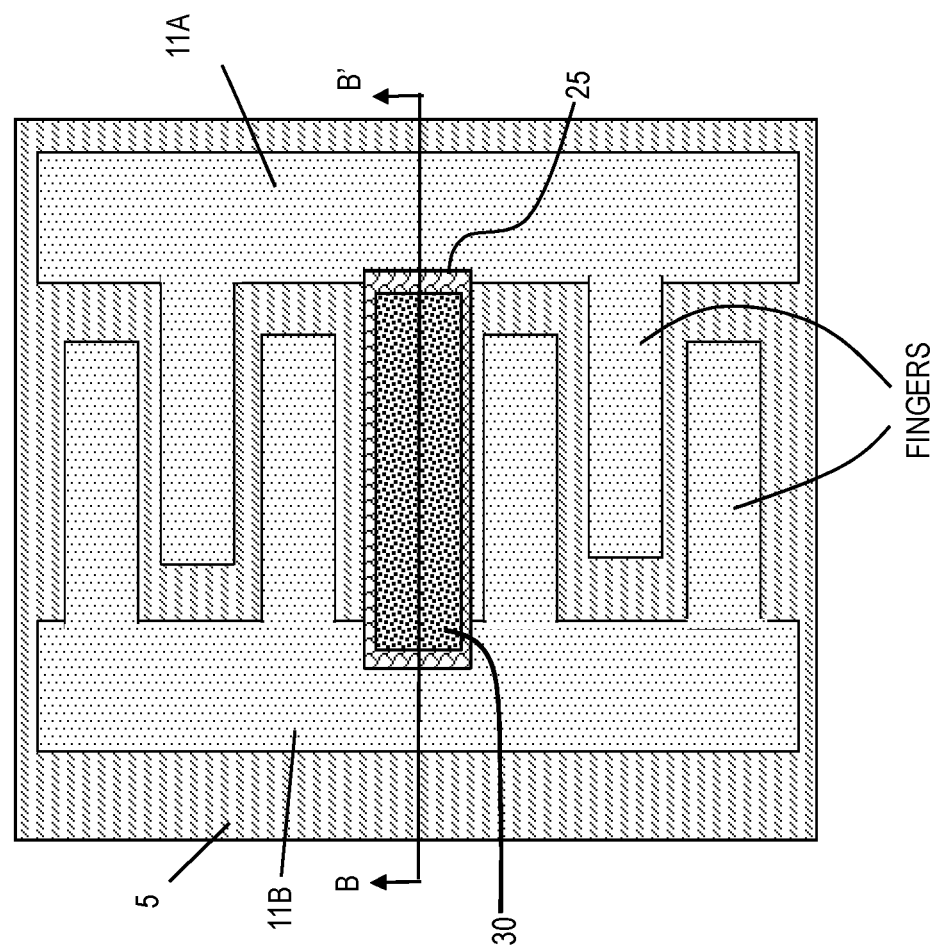
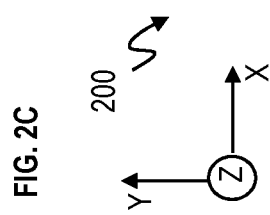
FIG. 2C

FIG. 4B  400

DEPOSIT CONFORMALLY ON AN INTER-LEVEL DIELECTRIC LAYER ON A TOP SURFACE OF THE SUBSTRATE, THE FIRST AND SECOND COUNTER ELECTRODES, AND THE FIRST AND SECOND BASE ELECTRODES 430

FORM A CONTACT BRIDGE CONNECTING THE FIRST COUNTER ELECTRODE AND THE SECOND COUNTER ELECTRODE AFTER PLANARIZING THE INTER-LEVEL DIELECTRIC LAYER 435

FORM AN AIR GAP UNDERNEATH THE CONTACT BRIDGE BY REMOVING THE INTER-LEVEL DIELECTRIC LAYER 440

TRILAYER JOSEPHSON JUNCTION STRUCTURE WITH SMALL AIR BRIDGE AND NO INTERLEVEL DIELECTRIC FOR SUPERCONDUCTING QUBITS

This application is a continuation of U.S. patent application Ser. No. 14/749,115 filed Jun. 24, 2015 which is a continuation of U.S. patent application Ser. No. 14/700,741, filed Apr. 30, 2015, the contents of which are incorporated by reference herein their entirety.

STATEMENT REGARDING FEDERALLY SPONSORED RESEARCH OR DEVELOPMENT

This invention was made with Government support under Contract No.: H98230-13-C-0220 awarded by the Department of Defense. The Government has certain rights to this invention.

BACKGROUND

The present invention relates to superconducting techniques, and more specifically, to a trilayer Josephson junction with a small air bridge and no interlevel dielectric for superconducting qubits.

In one approach called circuit quantum electrodynamics, quantum computing employs active superconducting devices called qubits to manipulate and store quantum information, and resonators (e.g., as a two-dimensional (2D) planar waveguide or as a three-dimensional (3D) microwave cavity) to read out and facilitate interaction among qubits. Each superconducting qubit comprises one or more Josephson junctions shunted by capacitors in parallel with the junctions. The qubits are capacitively coupled to 2D or 3D microwave cavities. The energy associated with the qubit resides in the electromagnetic fields around the Josephson junction and especially in the vicinity of relatively larger shunt capacitance structures. To date, a major focus has been on improving lifetimes of the qubits in order to allow calculations (i.e., manipulation and readout) to take place before the information is lost to decoherence of the qubits. Currently, superconducting qubit coherence times can be as high as 100 microseconds, and efforts are being made to increase the coherence times. One area of research with respect to increasing coherence times is focused on eliminating lossy materials from areas of relatively high electromagnetic field energy density such as in the vicinity of sharp corners and edges of the thin films of which the qubits are comprised. Such materials in proximity to the qubit can include imperfections that support defects known as two-level systems (TLSs).

SUMMARY

According to one embodiment, a method of forming a trilayer Josephson junction structure is provided. The method includes depositing a dielectric layer on a base electrode layer, where the base electrode layer is deposited on a substrate, depositing a counter electrode layer on the dielectric layer, forming a first counter electrode and a second counter electrode from the counter electrode layer. The method includes forming a first dielectric layer and a second dielectric layer from the dielectric layer, and forming a first base electrode and a second base electrode from the base electrode layer. The first counter electrode, the first dielectric layer, and the first base electrode form a first stack. The second counter electrode, the second dielectric layer, and second base electrode form a second stack. A shunting capacitor is formed between the first base electrode and the second base electrode. Also, the method includes depositing conformally an inter-level dielectric layer on a top surface of the substrate, the first and second counter electrodes, and the first and second base electrodes, forming a contact bridge connecting the first counter electrode and the second counter electrode after planarizing the inter-level dielectric layer to expose tops of the first and second counter electrodes, and forming an air gap underneath the contact bridge by removing the inter-level dielectric layer.

According to one embodiment, a trilayer Josephson junction structure is provided. A first stack is formed of a first counter electrode, a first dielectric layer, and a first base electrode. A second stack is formed of a second counter electrode, a second dielectric layer, and a second base electrode, where the first base electrode and the second base electrode are on a substrate, and where a shunting capacitor is formed between the first base electrode and the second base electrode. A contact bridge connects the first counter electrode and the second counter electrode. An air gap is underneath the contact bridge.

According to one embodiment, a trilayer Josephson junction structure is provided. A first stack is formed of a first counter electrode, a first dielectric layer, and a first base electrode. A second stack is formed of a second counter electrode, a second dielectric layer, and a second base electrode. The first base electrode and the second base electrode are on a substrate. A shunting capacitor is formed between the first base electrode and the second base electrode. A contact bridge connects the first counter electrode and the second counter electrode. Inter-level dielectric material encapsulates a first part of the first stack and encapsulates a second part of the second stack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A through 1L illustrate a process flow to fabricate a trilayer Josephson junction structure with a small air bridge for a superconducting qubit according to an embodiment, in which:

FIG. 1A is a top-down view of a starting stack of a trilayer Josephson junction structure;

FIG. 1B is a cross-sectional view of the starting stack;

FIG. 1C is a top-down view of counter electrode patterning;

FIG. 1D is a cross-sectional view of counter electrode;

FIG. 1E is a top-down view of base electrode patterning including an interdigitated finger shunting capacitor;

FIG. 1F is a cross-sectional view of base electrode patterning;

FIG. 1G is a top-down view of filling and planarizing the qubit structure in the vicinity of the Josephson junction;

FIG. 1H is a cross-sectional view of filling and planarizing the qubit structure;

FIG. 1I is a top-down view of performing cross-over patterning;

FIG. 1J is a cross-sectional view of cross-over patterning;

FIG. 1K is a top-down view illustrating removal of the inter-level dielectric (ILD) layer; and FIG. 1L is a cross-sectional view illustrating that the inter-level dielectric layer is removed to form an air gap;

FIG. 2A is a top-down view of a trilayer Josephson junction structure according to another embodiment;

FIG. 2B is a cross-sectional view of the trilayer Josephson junction structure according to the other embodiment;

FIG. 2C is a top-down view of the trilayer Josephson junction structure showing additional electrode fingers according to the other embodiment;

FIGS. 4A and 4B together illustrate a method of forming a trilayer Josephson junction structure according to an embodiment.

DETAILED DESCRIPTION

Figure 3A:
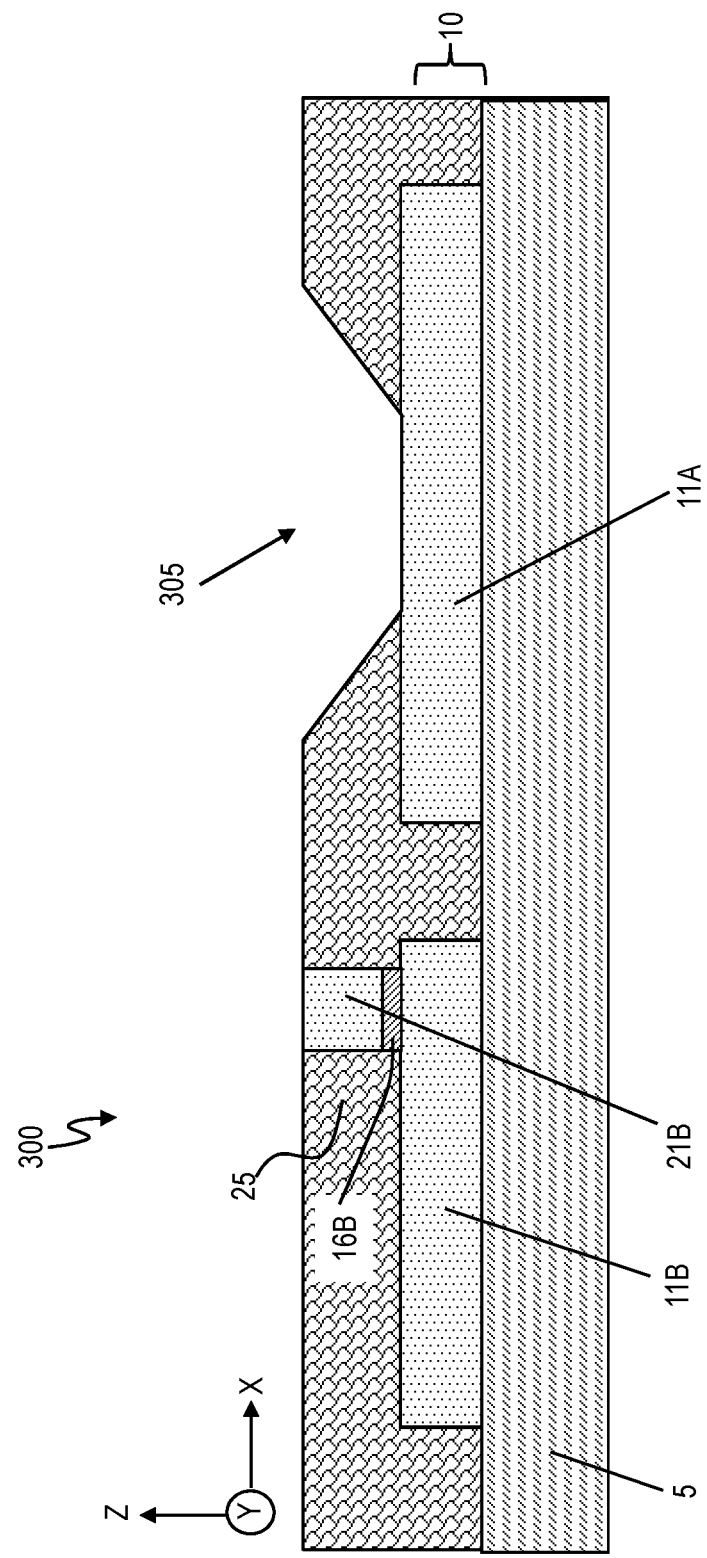
FIG. 3A is a cross-sectional view of a process flow for fabricating a trilayer Josephson junction structure according to a further embodiment.

Presently, high coherence superconducting qubits utilize Al/AlO$_x$/Al Josephson junctions that are fabricated using a dual-angle shadow evaporation process in combination with interdigitated finger shunting capacitors, typically fabricated of Nb. This approach minimizes the presence of deposited dielectrics which contain two-level systems (TLSs) known to reduce qubit coherence times. However, the ability to scale up such a process to large numbers of stable, reproducible, Josephson junctions is questionable.

Meanwhile, trilayer junction processes are now used pervasively for fabrication of Josephson junction logic devices and integrated circuits, as well as Josephson junction voltage standards. The industry standard approach involves Nb/AlO$_x$/Nb trilayers. Such refractory trilayers combined with dry etch, conformally deposited inter-level dielectric (ILD), and chemical-mechanical polish (CMP) planarization techniques enable very controllable, reproducible, and stable deep-submicron junctions with self-aligned counter-electrode contacts. Unfortunately, attempts to fabricate qubits using such processes have led to relatively poor results with the best $T_1$ and $T_2$ times <500 nanoseconds (ns). It is assumed that two-level systems present in the ILD (for example deposited SiO$_x$ or SiN) or possibly in the junction barrier itself are at fault. Results for Al/AlO$_x$/Al trilayer junctions have been comparable. For such devices, the shunting capacitors have typically been structured as superconductor/ILD/superconductor sandwiches with a large participation ratio (fraction of the qubit's electromagnetic field energy) of the ILD in determining the coherence times T1 and T2. Attempts to improve coherence by removing the ILD to form air-gap capacitor structures have not improved qubit performance, independent of the trilayer.

$T_1$ is called the "relaxation time", "longitudinal coherence time", "spontaneous emission time", or "amplitude damping." $T_1$ measures the loss of energy from the qubit system. $T_1$ is a measure of how long it takes for the excited state of the qubit to decay to the ground state. $T_2$ is called the "phase coherence time" of the qubit. $T_2$ is a measure of how long the qubit maintains coherence in a phase that is predictable.

It is asserted that, in trilayer qubits demonstrated to date, trilayer junctions have not competently performed, as the results have all been heavily contaminated by losses in the capacitor. Even in the air-gap case, there is still a large participation ratio coming from the extensive inner surface area of the capacitor, and such surfaces are known to be problematic in terms of lossy debris remaining on the surfaces which may contain two-level systems.

According to an embodiment, the interdigitated finger capacitor is shown to avoid this problem by having only a relatively small fraction of the field energy in the surface and by having a low-loss substrate, e.g., high purity sapphire or silicon. Embodiments describe a qubit consisting of an interdigitated finger capacitor in combination with a trilayer junction having the inter-level dielectric (ILD) removed to form a very small air-gap structure for contacting the base electrode. This leaves the qubit with essentially the same interdigitated capacitor as in present "good" qubits (no ILD above or below) in combination with a trilayer Josephson junction having no ILD. For Al/AlO$_x$/Al trilayer junctions, the performance should be comparable with that achieved with shadow evaporated Al/AlO$_x$/Al junctions in the state-of-the-art. For Nb/AlO$_x$/Nb junctions, the performance may be comparable to the state-of-the-art, although it could be possible that the performance may be degraded by losses in the junctions themselves; however, these losses may be negligible, as with Al/AlO$_x$/Al junctions.

FIGS. 1A through 1L illustrate views of a process flow to fabricate a trilayer Josephson junction structure 100 with a small air bridge and no inter-level dielectric for superconducting qubits according to an embodiment. In one case, the superconducting qubits may be transmon qubits.

FIG. 1A illustrates a top-down view of a starting stack for the trilayer Josephson junction structure 100, while FIG. 1B illustrates a cross-sectional view of the starting stack of the trilayer Josephson junction structure 100. The structure 100 includes a substrate 5 which may be the wafer. The substrate 5 may be silicon, sapphire, etc. A base electrode layer 10 is deposited on top of the substrate 5, and a dielectric layer 15 is deposited on top of the base electrode layer 10. A counter electrode layer 20 is deposited on top of the dielectric layer 15. FIG. 1A shows the counter electrode layer 20 and identifies that the cross-sectional view is taken from line A-A'.

A stack 110 is formed by the base electrode layer 5, the dielectric layer 15, and the counter electrode layer 20. For a silicon substrate 5, the stack 110 may be niobium (Nb) as the base electrode 5, a combination of aluminum (Al) and aluminum oxide (AlO$_x$) as the dielectric layer 15, and niobium (Nb) as the counter electrode 20 in one example. Also, the stack 110 may be Nb/AlO$_x$/Nb on the silicon substrate 5.

For a sapphire substrate 5, the stack 110 may be titanium nitride (TiN) as the base electrode 5, hafnium oxide (HfO$_2$) as the dielectric layer 15, and titanium nitride (TiN) as the counter electrode 20 in another example.

FIG. 1C is a top-down view illustrating counter electrode patterning of the counter electrode layer 20. The counter electrode layer 20 is etched into a large counter electrode 21A and a small counter electrode 21B. In FIG. 1C, a cross-sectional view is taken along line B-B'. FIG. 1D is a cross-sectional view of counter electrode patterning of the counter electrode layer 20. FIG. 1D shows that the dielectric layer 15 is also patterned, along with the counter electrode layer 20, resulting in a large dielectric layer 16A underneath the large counter electrode layer 21A and resulting in a small dielectric layer 16B underneath the small counter electrode layer 21B.

A large contact junction 25A is formed at the interface of the large dielectric layer 16A and large counter electrode 21A. Similarly, a qubit junction 25B is formed at the interface of the small dielectric layer 16B and small counter electrode 21B. FIGS. 1C and 1D show that the etching can stop on the dielectric layer 15. In another implementation, the etching can stop within the base electrode layer 10 (without reaching the substrate 5).

The width in the x-axis of the small counter electrode layer 21B may range from 30 to 1000 nanometers (nm). In one case, the width of the small counter electrode 21B may be approximately 100 nm.

The width in the x-axis of the large electrode layer 21A may be 0.5 µm in one example or 1 µm in another example. The width in the x-axis of the large electrode layer 21A may range from 0.5-1 µm. The area (as measured by the x-axis and y-axis) of the large electrode layer 21A is formed to be 5 times and/or more the area of the small counter electrode 21B. A distance D1 is defined between the large counter electrode layer 21A and the small counter electrode layer 21B. The distance D1 may be approximately 100 to 1000 nm.

FIG. 1E is a top-down view of base electrode patterning of the base electrode layer 10. The base electrode layer 10 is patterned into base electrode part 11A and base electrode part 11B. The base electrode part 11A forms one interdigitated electrode of the shunting capacitor and the base electrode part 11B forms the other interdigitated electrode of the shunting capacitor. Although only three interdigitated fingers are shown for simplicity, the number of interdigitated fingers may range from 2 to 21 or more as understood by one skilled in the art. For example, FIG. 2C shows more interdigitated fingers.

FIG. 1F is a cross-sectional view of base electrode patterning of the base electrode layer 10. The base electrode part 11A is directly underneath the large dielectric layer 16A, and the base electrode part 11B is directly underneath the small dielectric layer 16B. A distance D2 is defined between the base electrode part 11A and base electrode part 11B. The distance D2 may be approximately 50 to 500 nm less than D1.

FIG. 1G is a top-down view of filling and planarizing the structure 100. An inter-level dielectric (ILD) material 25 may be conformally deposited on the structure 100 and then planarized. FIG. 1H is a cross-sectional view of filling and planarizing the structure 100. The inter-level dielectric material 25 may be deposited by spin-on, sputtering, or CVD techniques for example. The inter-level dielectric (ILD) material 25 may be polysilicon, oxide, nitride, etc. The planarization may be by chemical-mechanical planarization/polishing and/or etching. As can be seen, the structure 100 is planarized to expose the top of the large counter electrode 21A and the top of the small counter electrode 21B in the z-axis. Hidden lines are shown in FIG. 1G to represent the base electrode part 11A and base electrode part 11B both of which are covered by the inter-level dielectric layer 25.

FIG. 1I is a top-down view of performing cross-over patterning while FIG. 1J is a cross-sectional view of the cross-over patterning. A self-aligned contact bridge 30 is formed, where self-aligned refers to the fact that there is no additional alignment tolerance that must be accommodated as would be the case in a non-planar process where the contact hole through the dielectric over the pedestal structure (top surface of layer 21B) and fully positioned within the perimeter of the pedestal structure would be required. The contact bridge 30 is formed on top of both the large counter electrode 21A and the small counter electrode 21B, thus providing an electrical connection between the two. The contact bridge 30 also covers a portion of the inter-level dielectric layer 25. The contact bridge 30 may be a metal such as niobium, aluminum, and/or another superconducting material. In one case, the superconducting material of the contact bridge 30 is deposited, and then lift-off is performed to leave the patterned contact bridge 30. In another case, after depositing the superconducting material of the contact bridge 30, etching is performed to pattern the contact bridge 30.

FIG. 1K is a top-down view illustrating removal of the inter-level dielectric (ILD) layer 25. FIG. 1K shows that the surface of the substrate 5 with no inter-level dielectric layer 25 on top. Also, the inter-level dielectric material 25 has been removed from the base electrode part 11A and base electrode part 11B.

FIG. 1L is a cross-sectional view illustrating removal of the inter-level dielectric layer 25. The inter-level dielectric layer 25 may be removed by wet etching, dry etching, and/or a combination of both wet and dry etching. Removal of the inter-level dielectric layer 25 leaves an air gap 35 under the contact bridge 30 (between the large and small counter electrodes 21A and 21B, between the base electrode parts 11A and 11B under the contact bridge 30, vertically between the contact bridge 30 and substrate 5). Accordingly, the trilayer Josephson junction structure 100 is formed. The trilayer Josephson junction structure 100 has a trilayer of the base electrode part 11B, the dielectric layer 16B, and the small counter electrode 21B (which is the trilayer stack that forms the superconducting qubit). The contact bridge 30 is an air bridge with the air gap 35 underneath. The large contact junction (21A, 16A, part of 11A) acts as a short to electrically connect the counter electrode 21B of the qubit Josephson junction (21B, 16B, part of 11B) back to the lower metal layer 11A that then forms the other electrode of the shunt capacitor. The shunt capacitor is formed between the base electrode parts 11A and 11B, particularly between the fingers of base electrode parts 11A and 11B. One skilled in the art understands that the fingers of base electrode parts 11A and 11B form an interdigitated capacitor.

In contrast to embodiments, the state-of-the-art trilayer process is not optimal for qubits, because the state-of-the-art structure is filled with the ILD; this ILD is lossy (i.e., absorbs energy via two-level systems) and degrades coherence times of the superconducting qubit.

However, unlike the state-of-the-art structure, the trilayer Josephson junction structure 100 has removed the inter-level dielectric material 25 (e.g., oxide).

An alternative embodiment of a trilayer Josephson junction structure 200 is illustrated in FIGS. 2A, 2B, and 2C. FIGS. 2A and 2B include the process flow discussed in FIGS. 1A though 1J above. The process flow in FIGS. 1G and 1H shows that the inter-level dielectric layer 25 has been deposited and planarized. After depositing and patterning the contact bridge 30 in FIGS. 1I and 1J, FIG. 2A is a top-down view illustrating that a portion of the inter-level dielectric material 25 is retained after etching. FIG. 2B is a cross-sectional view showing that the inter-level dielectric material 25 is retained in the immediate area of the large contact junction 21A and the qubit junction 21B. An additional level of lithography is required to define the limited area where the inter-level dielectric material 25 is to remain. For representative qubits fabricated in this way, this leaves a large fraction of the shunt capacitor in a condition much as that in a standard high coherence time qubit with an evaporated Al/AlOx/Al junction and a shunt capacitor with many interdigitated Nb fingers.

FIG. 2C shows the top view with additional electrode fingers extending in the x-axis. The additional electrode fingers are attached to base electrode parts 11A and 11B. One skilled in the art understands that the superconducting qubits discussed herein are not limited to an interdigitated shunt capacitor with only three fingers. Rather, the interdigitated shunt capacitor may have numerous fingers to render a capacitance sufficiently large to enable desired qubit characteristics. FIG. 2C illustrates that only a small portion of the trilayer Josephson junction structure 200 has the inter-level dielectric material 25 in the immediate proximity of the tunnel junction formed by the combination/sandwich of layers 21B, 16B, and 11B, while inter-level dielectric material 25 is completely removed from being under, beside, and/or on top of the other finger electrodes respectively extending from base electrode parts 11A and 11B.

Figure 3B:
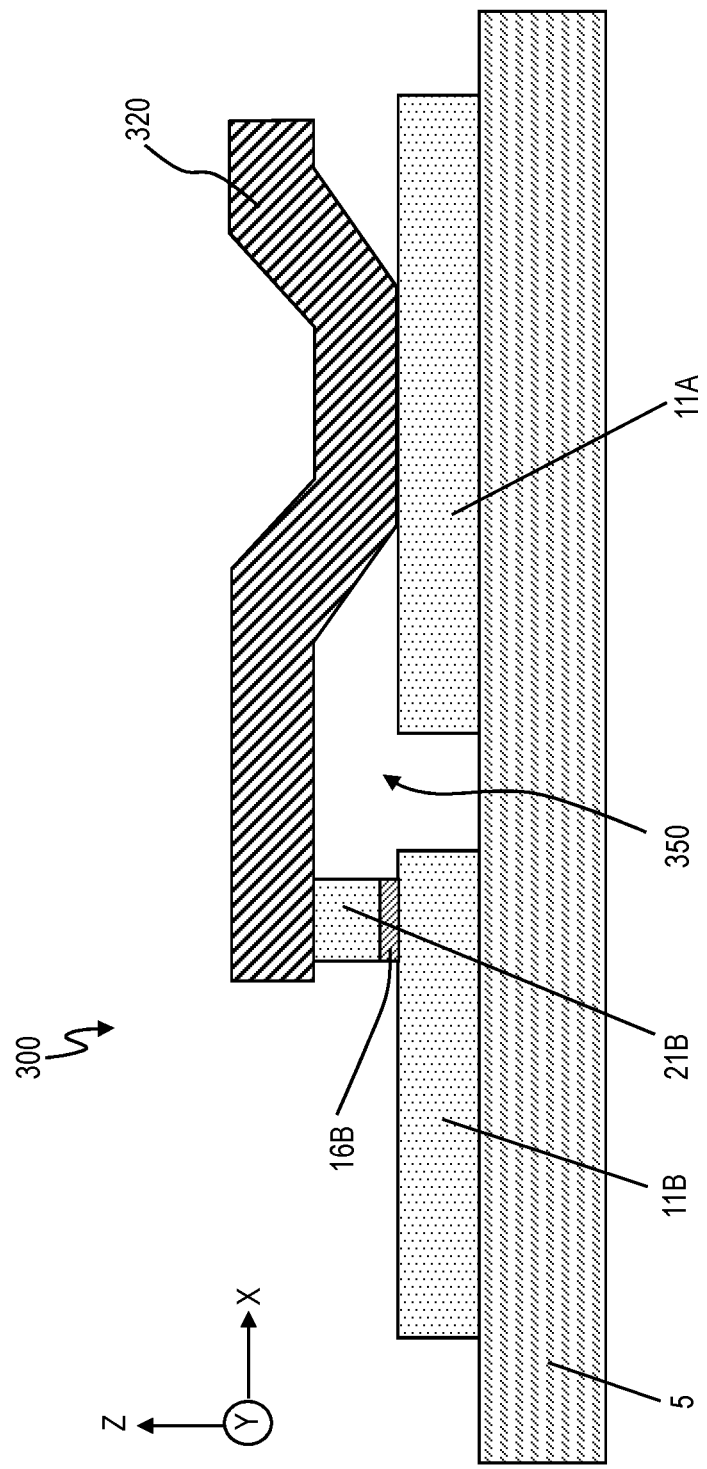
FIG. 3B is a cross-sectional view of a non-planarized contact formed in the trilayer Josephson junction structure according to the further embodiment.

FIGS. 3A and 3B are cross-sectional views of a process flow for fabricating a trilayer Josephson junction structure 300 according to an alternative embodiment. In this alternative approach, there is a non-planarized contact utilized in place of the large counter electrode layer 21A. Particularly, the base electrode part 11A is utilized in place of the large counter electrode layer 21A. After planarizing the inter-level dielectric material 25 as discussed in FIGS. 1G and 1H (but without the large counter electrode 11A and large dielectric layer 16A), etching is performed to pattern a tapered contact hole 305 through the planarized inter-level dielectric layer 25 down to the base electrode part 11A, such that the base electrode part 11A is exposed. FIG. 3B is a cross-sectional view showing that a non-planarized contact 320 is formed. The non-planarized contact 320 is formed by conformally depositing the superconducting material of the non-planarized contact 320 on top of the inter-level dielectric material 25 of the structure 300 in FIG. 3A (not shown). Depositing the superconducting material of the non-planarized contact 320 also fills the patterned contact hole 305. The superconducting material of the non-planarized contact 320 is patterned, and the inter-level dielectric material 25 is etched away (as discussed herein). Etching away the inter-level dielectric material 25 leaves the non-planarized contact 305 on top of the base electrode part 11A and on top of the small counter electrode 21B. The non-planarized contact 320 has an angled step-like shape, and the non-planarized contact 320 is utilized in place of the large contact junction 25A. In this embodiment, the slanted non-planarized contact 305 becomes an air bridge with an air gap 350 (similar to air gap 35). The superconducting material of the non-planarized contact 320 may include aluminum, niobium, and other superconducting materials.

Although discussion has be provided with respect to a tunnel junction with interdigitated fingers (e.g., referred to as 2D qubits), embodiments also apply to other geometries including so-called 3D qubits used in conjunction with 3D cavities. In this case, rather than having an interdigitated shunt capacitor, 3D qubits have a single large rectangular paddle (pad) on the right side and another on the left side of the qubit. The qubit is connected by electrodes to the left and right large rectangular paddles.

Figure 4A:
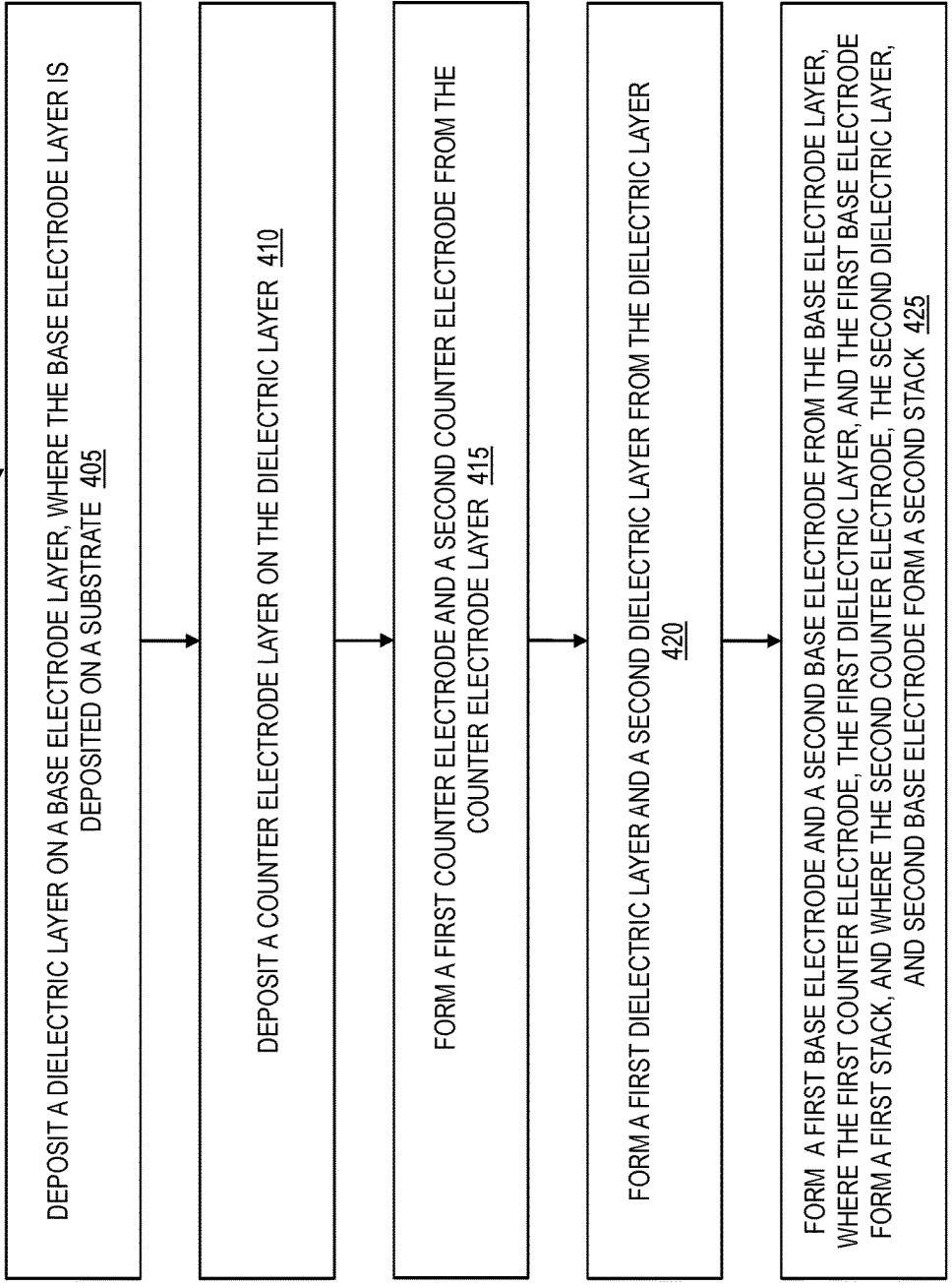

FIGS. 4A and 4B illustrate a method 400 of forming a trilayer Josephson junction structure 100 according to an embodiment.

At block 405, the dielectric layer 15 is deposited on top of the base electrode layer 15, where the base electrode layer 15 is deposited on top of the substrate 5.

At block 410, the counter electrode layer 20 is deposited on top of the dielectric layer 15.

At block 415, a first counter electrode (e.g., larger counter electrode 21A) and a second counter electrode (e.g., small counter electrode 21B) are formed from the counter electrode layer 20.

At block 420, a first dielectric layer (e.g., large dielectric layer 16A) and a second dielectric layer (e.g., small dielectric layer 16B) are formed from the dielectric layer 15.

At block 425, a first base electrode (e.g., base electrode part 11A) and a second base electrode (e.g., base electrode part 11B) are formed from the base electrode layer 10, where the first counter electrode (e.g., large counter electrode 16A), the first dielectric layer (large dielectric layer 16A), and the first base electrode (base electrode part 11A) form a first stack, and where the second counter electrode (e.g., small counter electrode 21B), the second dielectric layer (e.g., small dielectric layer 16B), and the second base electrode (base electrode part 11B) form a second stack. The second stack is the qubit tunnel junction. A shunting capacitor is formed between the first base electrode (e.g., the base electrode part 11A) and the second base electrode (e.g., base electrode part 11B).

At block 430, the inter-level dielectric layer 25 is deposited conformally on the top surface of the substrate 5, the first and second counter electrodes (large and small counter electrodes 21A and 21B), and the first and second base electrodes (base electrode parts 11A and 11B), as shown in FIGS. 1G and 1H.

At block 435, the contact bridge 30 is formed on top of and to connect to the first counter electrode (e.g., large counter electrode 21A) and the second counter electrode (e.g., small counter electrode 21B), after planarizing the inter-level dielectric layer 25 to expose tops of the first and second counter electrodes, as shown in FIGS. 1I and 1J.

At block 440, the air gap 35 is formed underneath the contact bridge 30 by removing the inter-level dielectric layer 25.

The inter-level dielectric layer 25 may comprise at least one of an oxide, polysilicon, and/or nitride.

The air gap 35 underneath the contact bridge 30 vertically extends (in the z-axis) between the contact bridge 30 and the substrate 5, as shown in FIG. 1L. Also, the air gap 35 underneath the contact bridge 30 horizontally extends (in the x-axis) between the first counter electrode (e.g., larger counter electrode 21A) and the second counter electrode (e.g., small counter electrode 21B). The air gap 35 underneath the contact bridge 30 horizontally extends (in the x-axis) between the first base electrode (e.g., base electrode part 11A) and the second base electrode (e.g., base electrode part 11B).

The first dielectric layer (e.g., large dielectric layer 16A) and the second dielectric layer (e.g., small dielectric layer 16B) include an oxide. The first dielectric layer and the second dielectric layer include at least one of hafnium oxide, aluminum oxide, and/or polymeric material.

The first base electrode (e.g., base electrode part 11A) and the second base electrode (e.g., base electrode part 11B) include at least one of niobium, titanium nitride, aluminum, and/or niobium nitride. The first counter electrode (e.g., larger counter electrode 21A) and the second counter electrode (e.g., small counter electrode 11B) include at least one of niobium, titanium nitride, aluminum, and/or niobium nitride. The first base electrode (base electrode part 11A) and the second base electrode (base electrode part 11B) form interdigitated electrodes on the substrate 5, as shown in FIGS. 1E and 1G.

In the state-of-the-art, one example of a superconducting qubit that has demonstrated excellent coherence times is a small (~100 nm×100 nm) shadow evaporated Al/AlOx/Al Josephson junction shunted by an interdigitated finger capacitor in the form of two intersecting Nb combs. The junction is centrally located and positioned between the tip of one of the fingers and the body of the opposing comb. Al leads from the junction region connect to the previously fabricated Nb comb structures. The physical size of such qubits is dominated by the area occupied by the capacitor and this area may be 100 by 100 µm or greater. To make the device more compact numerous attempts have been made to fabricate the capacitor as a parallel plate structure with a base electrode, a deposited inter-level dielectric layer, and a counter-electrode. Such attempts have typically also incorporated some form of trilayer junction technology. Coherence performance has been poor with coherence times typically less than 300 ns. Attempts to improve the coherence, including removal of the ILD have not improved the coherence. A likely reason for this is that it is very difficult to completely remove the ILD from the parallel plate capacitor structure where the aspect ratio of the sandwiched ILD may be on the order 100 or more. Any remaining ILD debris may contain TLSs which prevent the coherence from significantly improving. It is also possible that the trilayer junction, which has not been independently vetted, may be limiting the coherence. The aspect ratio describes the relationship between the width and the height, so an aspect ratio of 100 has a width:height ratio of 100:1.

According to embodiment, in the present approach the tunnel junction and capacitor are much more cleanly separated. The interdigitated Nb capacitor is known to be consistent with excellent qubit coherence. After removal of the ILD (e.g., the inter-level dielectric 25) the known good interdigitated finger structure is restored. The ILD can be completely removed with dry or wet etching techniques, with no chance for remaining ILD in embodiments unlike the high aspect ratio situations. Even in the vicinity of Josephson junctions, the aspect ratio is at most only 3 or 4, and in addition, this is a small region and only a very small fraction of the electromagnetic field energy of the qubit resides there. The present approach thus combines the good capacitor design with trilayer Josephson junction technology known to have very good stability and scalability features. If it turns out that the Nb/AlOx/Nb junction itself contributes significantly to decoherence, then an alternative approach with, e.g., Al/AlOx/Al trilayer junctions can be used, where Al/AlOx/Al junctions are consistent with excellent coherence.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of forming a trilayer Josephson junction structure, the method comprising:
    forming a first stack and a second stack on a substrate;
    forming an inter-level dielectric layer at least on the first stack and the second stack;
    forming a contact bridge connecting the first stack and the second stack; and
    forming an air gap underneath the contact bridge by removing the inter-level dielectric layer from at least under the contact bridge.

2. The method of claim 1, wherein the first stack comprises a first base electrode and the second stack comprises a second base electrode.

3. The method of claim 2, wherein the first and second base electrodes have been formed from a base electrode layer, the base electrode layer being formed on the substrate.

4. The method of claim 2, wherein a capacitor is formed between the first base electrode and the second base electrode.

5. The method of claim 2, wherein the first base electrode and the second base electrode are selected from the group consisting of niobium, titanium nitride, aluminum, and niobium nitride.

6. The method of claim 2, wherein the air gap underneath the contact bridge horizontally extends between the first base electrode and the second base electrode.

7. The method of claim 2, wherein the first stack comprises a first dielectric layer and the second stack comprises a second dielectric layer.

8. The method of claim 7, wherein the first and second dielectric layers have been formed from a dielectric layer.

9. The method of claim 7, wherein the first dielectric layer and the second dielectric layer are selected from the group consisting of an oxide and a nitride.

10. The method of claim 7, wherein the first stack comprises a first counter electrode and the second stack comprises a second counter electrode.

11. The method of claim 10, wherein the air gap underneath the contact bridge horizontally extends between the first counter electrode and the second counter electrode.

12. The method of claim 10, wherein the first base electrode and the first counter electrode sandwich the first dielectric layer; and wherein the second base electrode and the second counter electrode sandwich the second dielectric layer.

13. The method of claim 1, wherein the inter-level dielectric layer is selected from the group consisting of an oxide, polysilicon, nitride, and polymeric material.

14. The method of claim 1, wherein the air gap underneath the contact bridge vertically extends between the contact bridge and the substrate.

15. The method of claim 1, wherein either the first stack or the second stack is a qubit tunnel junction.

16. The method of claim 2, wherein the first base electrode and the second base electrode are interdigitated electrodes on the substrate.

17. A method of forming a trilayer Josephson junction structure, the method comprising:

forming a first base electrode and a second base electrode on a substrate, the first base electrode being in a stack;

forming an inter-level dielectric layer at least on the first base electrode and the second base electrode;

forming a contact bridge connecting the stack and the second base electrode; and forming an air gap underneath the contact bridge by removing the inter-level dielectric layer from at least under the contact bridge.

18. The method of claim 17, wherein forming the air gap underneath the contact bridge by removing the inter-level dielectric layer from at least under the contact bridge comprises:

forming the inter-level dielectric layer on the stack, the second base electrode, and the substrate;

forming a contact hole to expose a portion of the second base electrode;

forming the contact bridge to contact the second base electrode through the contact hole, such that removing the inter-level dielectric layer leaves the contact bridge on the stack and the second base electrode.

19. The method of claim 17, wherein the contact bridge is slanted toward the second base electrode.

20. The method of claim 17, wherein the stack comprises a counter electrode, first dielectric layer, and the first base electrode.

* * * * *